(12) United States Patent
Shen

(10) Patent No.: US 11,519,990 B1
(45) Date of Patent: Dec. 6, 2022

(54) MAGNETIC RESONANCE IMAGING SYSTEM AND METHOD

(71) Applicant: GE Precision Healthcare LLC, Wauwatosa, WI (US)

(72) Inventor: Hao Shen, Sussex, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/588,443

(22) Filed: Jan. 31, 2022

(51) Int. Cl.
*G01R 33/56* (2006.01)

(52) U.S. Cl.
CPC .................. *G01R 33/5608* (2013.01)

(58) Field of Classification Search
CPC .................................. G01R 33/5608
See application file for complete search history.

(56) References Cited

U.S. PATENT DOCUMENTS

| 6,127,826 A | * | 10/2000 | Thompson | ....... G01R 33/56554 |
| | | | | 324/309 |
| 6,903,551 B2 | | 6/2005 | Madore | |
| 2017/0046826 A1 | * | 2/2017 | Konen | .................. G06T 3/0068 |
| 2019/0287674 A1 | * | 9/2019 | Nitta | ..................... G06V 10/454 |

* cited by examiner

*Primary Examiner* — Gregory H Curran

(57) ABSTRACT

A method for producing an image of an object with a MRI system includes providing a Shear In Readout Encoding Imaging (SIREN) gradient pulse in a phase gradient signal waveform. The phase gradient signal waveform is applied to a phase gradient coil of the MRI system. The application of the SIREN gradient pulse provides a SIREN k-space of the object which has SIREN k-space lines with a shear angle. A MR image space data from the SIREN k-space is then obtained by applying a reconstruction technique. Finally, the image of the object is generated by transforming SIREN MR image space data into regular image space data using a decoding algorithm based on the shear angle.

20 Claims, 10 Drawing Sheets

MAGNETIC RESONANCE IMAGING SYSTEM AND METHOD

BACKGROUND

Embodiments disclosed in the present invention relate to medical imaging technologies, and more specifically to a method for obtaining magnetic resonance imaging (MRI) data and a magnetic resonance imaging system.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

MRI may include one or more types of artifacts, which may decrease image clarity and resolution. The presence of artifacts in a medical image may impact diagnostic quality. Phase aliasing or phase wrap around is one such artifact that occurs in MR images when the field of view (FOV) in the phase encoding direction is smaller than the body part being imaged. In general, objects outside of one side of the phase FOV are projected onto the other side of the phase FOV in the image. This type of artifact can be addressed by increasing the phase FOV. However, increasing phase FOV also increases overall scan time for MRI.

Therefore, there is a need for an improved magnetic resonance imaging system and method.

BRIEF DESCRIPTION

In accordance with an embodiment of the present technique, a method for producing an image of an object with a magnetic resonance imaging (MRI) system is provided. The method includes providing a Shear In Readout Encoding Imaging (SIREN) gradient pulse in a phase gradient signal waveform applied to a phase gradient coil of the MRI system. The method also includes obtaining a SIREN k-space of the object, wherein k-space lines of the SIREN k-space have a shear angle. The MR image space data is then obtained from the SIREN k-space. The method further includes generating the image of the object by transforming SIREN MR image space data into regular image space data using a decoding algorithm based on the shear angle.

In accordance with another embodiment of the present technique, a MRI system having a magnet configured to generate a polarizing magnetic field about at least a portion of an object arranged in the MRI system is provided. The MRI system includes a gradient coil assembly including a readout gradient coil, a phase gradient coil, a slice selection gradient coil configured to apply at least one gradient field to the polarizing magnetic field. Further a radio frequency (RF) system is configured to apply an RF field to the object and to receive magnetic resonance signals from the object. The MRI system also includes a processing system which is programmed to provide a Shear In Readout Encoding Imaging (SIREN) gradient pulse in a phase gradient signal waveform, wherein the phase gradient signal waveform is applied to the phase gradient coil. The processing system is also programmed to obtain a SIREN k-space of the object, wherein k-space lines of the SIREN k-space have a shear angle. The MR image space data is then obtained from the SIREN k-space. The processing system is further programmed to generate the image of the object by transforming SIREN MR image space data into regular image space data using a decoding algorithm based on the shear angle.

In accordance with yet another embodiment of the present technique, a method for producing an image of an object with a magnetic resonance imaging (MRI) system is provided. The method includes providing a Shear In Readout Encoding Imaging (SIREN) gradient pulse in a phase gradient signal waveform applied to a phase gradient coil of the MRI system. The method further includes obtaining a SIREN k-space data of the object, wherein k-space lines of the SIREN k-space data have a shear angle. The method also includes transforming SIREN k-space data of the object into regular domain k-space data using a decoding algorithm based on the shear angle. Finally, the method includes generating the image of the object from the regular domain k-space data.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

In magnetic resonance imaging (MRI), an object is placed in a magnet. When the object is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and extends in the longitudinal or z direction. In acquiring a MR image, a magnetic field (referred to as an excitation field B1), which is in the x-y plane and near the Larmor frequency, is generated by a radiofrequency (RF) coil and may be used to rotate, or "tip," the net magnetic moment $M_z$ of the nuclei from the z direction to the transverse or x-y plane. A signal, which is referred to as a MR signal, is emitted by the nuclei, after the excitation signal B1 is terminated. To use the MR signals to generate an image of an object, magnetic field gradient pulses ($G_x$, $G_y$, and $G_z$) are used. The gradient pulses are used to scan through the k space, the space of spatial frequencies or inverse of distances. A Fourier relationship exists between the acquired MR signals and an image of the object, and therefore the image of the object can be derived by reconstructing the MR signals. The images of the object may include two dimensional (2D) or three-dimensional (3D) images.

Figure 1:
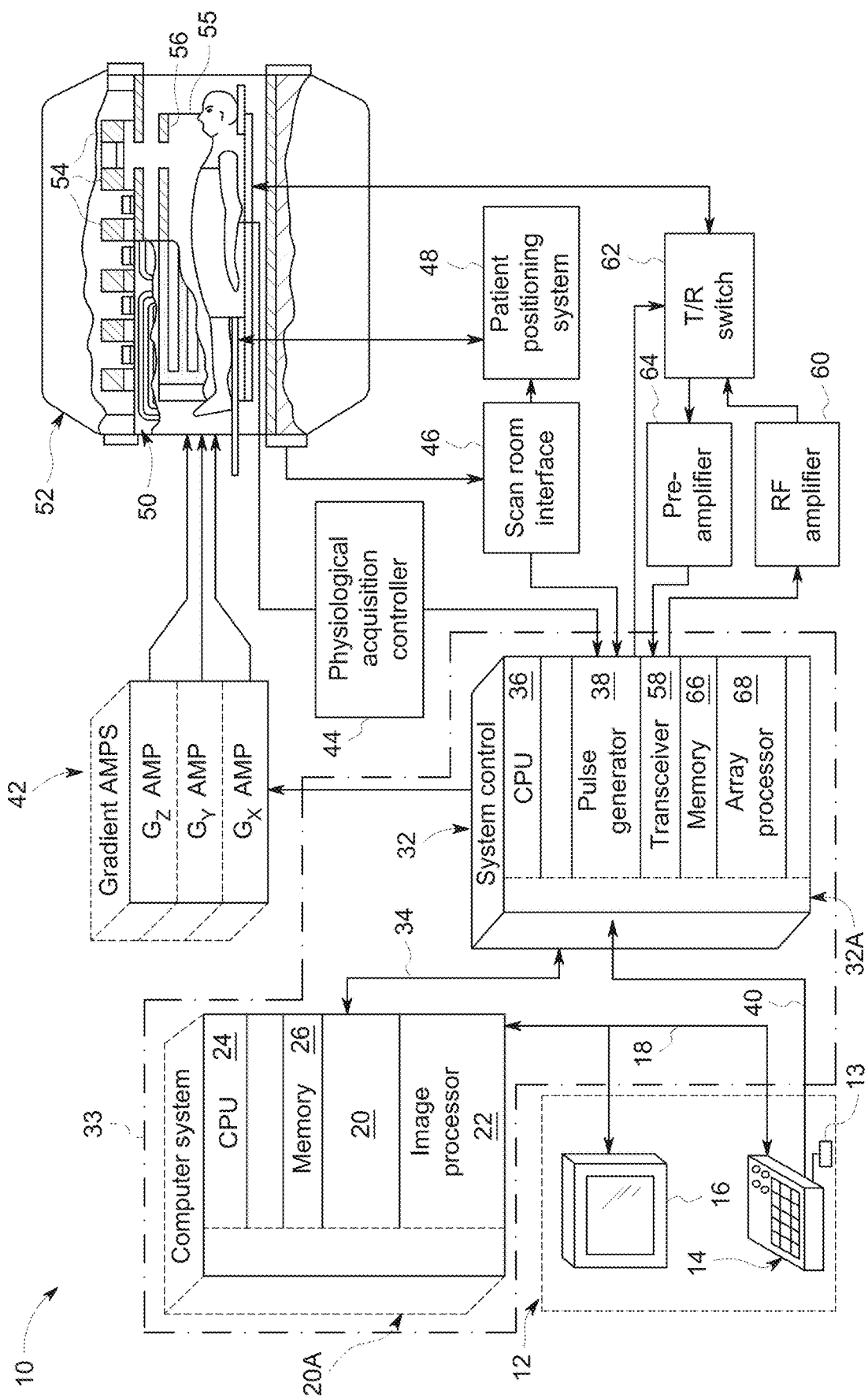
FIG. 1 is a schematic diagram of an exemplary magnetic resonance imaging (MRI) system, in accordance with an embodiment of the present technique.

Embodiments of the present disclosure will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20a. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32a. These modules include a CPU module 36 as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the object, such as ECG signals received from electrodes attached to the patient. As used herein, an object is a human (or patient), an animal, or a phantom. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy. Typical surface coil would have eight receiving channels; however, different number of channels are possible. Using the combination of both a body coil 56 and a surface coil is known to provide better image quality.

The pulse generator module 38 may operate the gradient amplifiers 42 to achieve desired timing and shape of the gradient pulses that are produced during the scan. The gradient waveforms produced by the pulse generator module 38 may be applied to the gradient amplifier system 42 having $G_x$, $G_y$, and $G_z$ amplifiers. Each gradient amplifier excites a corresponding physical gradient coil in a gradient coil assembly 50, to produce the magnetic field gradients used for spatially encoding acquired signals. Specifically, $G_x$ corresponds to a flow/frequency encoding gradient, $G_y$ corresponds to a phase encoding gradient and $G_z$ corresponds to a slice select gradient. The gradient coil assembly 50 may form part of a magnet assembly 52, which also includes a polarizing magnet 54 (which, in operation, provides a longitudinal magnetic field $B_0$ throughout a target volume 55 that is enclosed by the magnet assembly 52 and a whole-body RF coil 56 (which, in operation, provides a transverse magnetic field B1 that is generally perpendicular to B0 throughout the target volume 55. A transceiver module 58 in the MRI system control 32 produces pulses that may be amplified by an RF amplifier 60 and coupled to the RF coil 56 by a transmit/receive switch 62. The resulting signals emitted by the excited nuclei in the subject anatomy may be sensed by receiving coils (not shown) and provided to a preamplifier 64 through the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the receiving coil during the receive mode.

The MR signals produced from excitation of the target are digitized by the transceiver module 58. The MR system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. Complex MR images are MR images with each pixel represented by a complex number, which also has a real component and an imaginary component. The magnitude M of the received MR signal may be determined as the square root of the sum of the squares of the I and Q quadrature components of the received MR signal as in Eq. (3) below:

$$M=\sqrt{I^2+Q^2} \qquad (1)$$

and the phase $\phi$ of the received MR signal may also be determined as in eq. (2) below:

$$\phi = \tan^{-1}\left(\frac{Q}{I}\right) \qquad (2)$$

As discussed earlier, phase aliasing artifact occurs in MR images when the field of view (FOV) is smaller than the body part being imaged. In general, objects outside of one side of the FOV are projected onto the other side of the FOV in the image. In accordance with one embodiment of the present technique, the pulse generator module 38 generates Shear In Readout Encoding Imaging (referred henceforth as "SIREN") gradient pulses to the phase gradient (Gy) that results in shears in readout encoding direction. Due to this shear, phase aliasing direction changes from original phase direction. Therefore, when the objects outside of the FOV are projected to the other side of the FOV, they move out of the area of interest as will be explained in subsequent paragraphs. Finally, the only area of interest can be decoded back to original position to acquire reduced phase aliasing artifact image.

Figure 2:
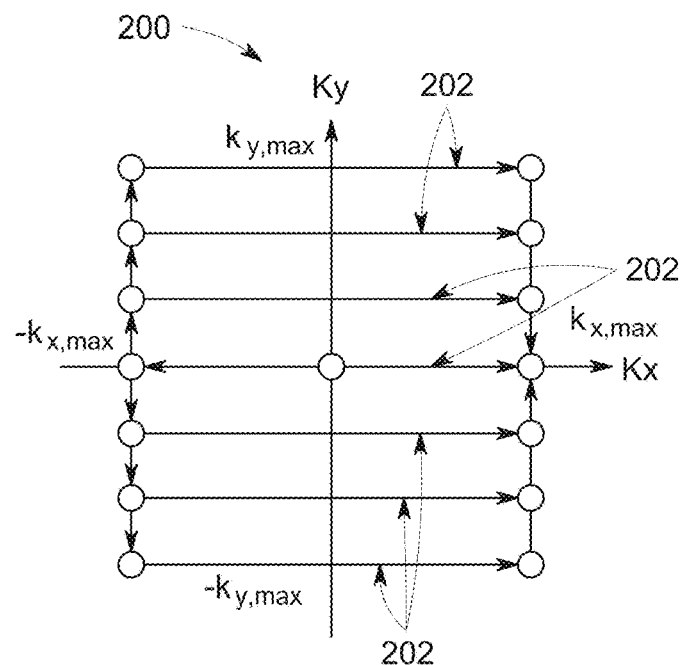
FIG. 2 is a schematic diagram of a k-space trajectory for a MRI system.

FIG. 2 is a schematic diagram of a k-space trajectory 200 in accordance with an embodiment of the present technique. The k-space 200 is also referred to as a regular cartesian k-space and is defined by the maximum kx or ky values $k_{x,max}$ and $k_{y,max}$ which is defined by maximum frequency- or phase-encoding gradients. The k-space 200 is. In general, k-space 200 represents raw data directly obtained from the MR signal wherein the k-space kx-ky values correspond to spatial frequencies of the MR image. In one embodiment, a plurality of excitation (NEX) images are acquired for each line 202 of k-space data.

Figure 3:
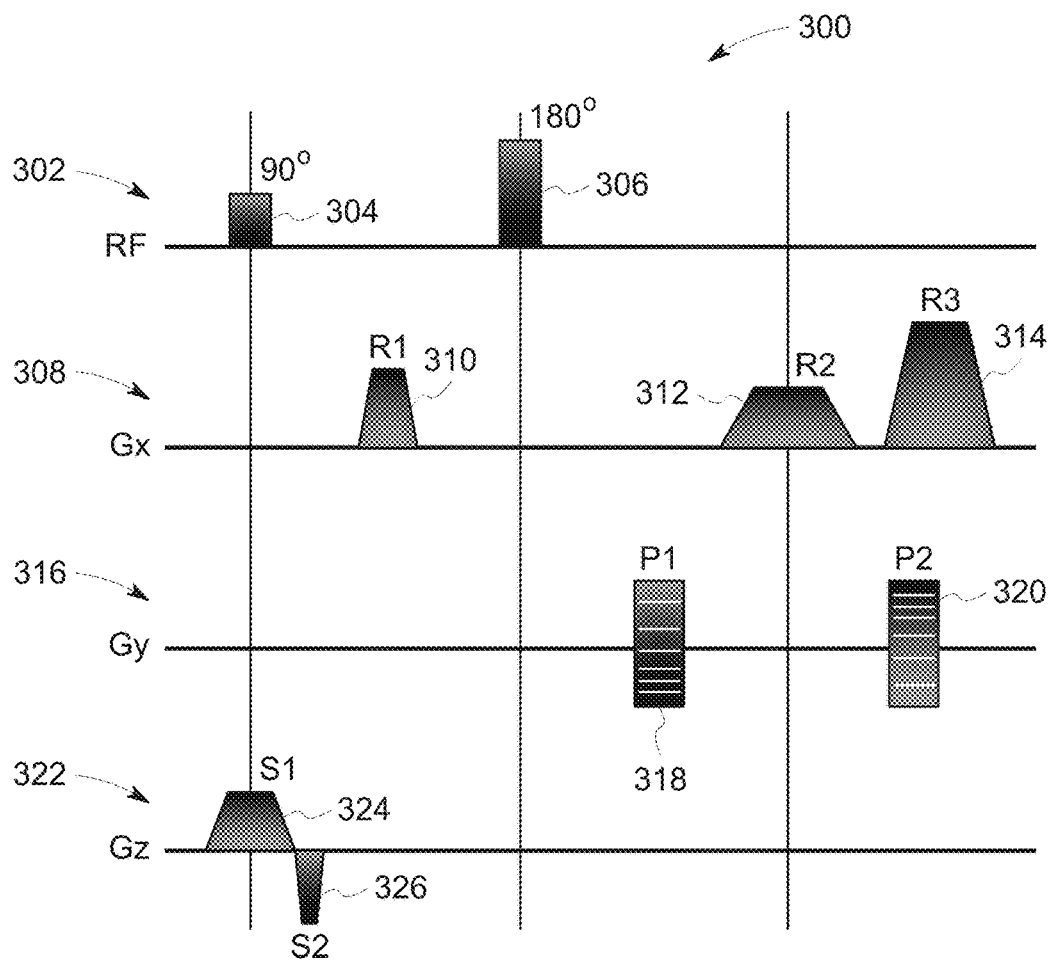
FIG. 3 is a schematic diagram of a pulse sequence diagram for a conventional MRI system.

FIG. 3 is a schematic diagram depicting a pulse sequence diagram 300 for a MRI system. The pulse sequences diagram 300 may be generated by different modules of MRI system control 32 of FIG. 1. In FIG. 3, plot 302 shows RF signal waveform which excites RF coil 56. Plot 308 shows readout gradient signal waveform Gx, plot 316 shows phase gradient signal waveform Gy and plot 322 shows slice selection gradient signal waveform Gz. Each of the gradient signal waveforms 308, 316 and 322 excites a corresponding physical gradient coil in a gradient coil assembly 50. The RF signal waveform 302 includes a 90° RF pulse 304 followed by a 180° RF pulse 306. This combination of 90° RF pulse and 180° RF pulse is repeated at each time interval TR (Repetition time) and is called as spin echo. With each repetition, a k-space line 202 of the k-space 200 is filled. As will be appreciated by those skilled in the art, the 180° RF pulse compensates for loss of transverse magnetization caused by magnetic field inhomogeneities. It should be noted that pulse sequence diagram 300 is just one example that represents a regular cartesian acquisition. However, in other embodiments, a different pulse sequence diagram such as gradient echo sequences or diffusion weighted sequence diagram may also be used.

The readout gradient signal waveform 308 shows a dephase lobe 310 having amplitude R1, a main readout lobe 312 having amplitude R2 and a spoiler lobe 314 having amplitude R3. As will be appreciated by those skilled in the art, the dephase lobe 310 causes spins to fall out of phase as a function of their position within the gradient. The main readout lobe 312 brings these spins back into phase to create the echo and the spoiler lobe 314 removes any residual transverse magnetization prior to the next excitation pulse.

The phase gradient signal waveform 316 shows a first phase encoding gradient 318 (having a peak amplitude P1) and a second phase encoding gradient 320 (having a peak amplitude P2). The first phase encoding gradient 318 is applied with a different amplitude with equal time duration (indicated by the horizontal hatchmarks) for each repetition time of the pulse sequence to provide a different degree of phase encoding on each repetition. In general, the amplitude of first phase encoding gradient 318 determines which line 202 of the k-space 200 gets filled. If the amplitude is positive then the k-space line 202 in upper half of the k-space 200 gets filled. On the other hand, if the amplitude of the first phase encoding gradient 318 is negative, the k-space line 202 in lower half of the k-space 200 gets filled. The second phase encoding gradient 320 is called as a rewinder gradient and is applied with reverse polarity (as that of gradient 318) at the end of every cycle. The purpose of these rewinder gradient is to ensure stability of the phase of the MR signal in each repetition interval i.e., to create a net zero phase shift and to aid in the development of coherent transverse magnetization.

The slice selection gradient signal waveform 322 has one upward lobe 324 (having amplitude S1) called as the main slice-select gradient and one downward lobe 326 (having amplitude S2) which is called as a slice rephasing lobe. The slice rephasing lobe 326 is applied right after the 90° RF pulse 304. As will be appreciated by those skilled in the art, the slice-rephasing lobe 326 helps correct for the phase dispersion of transverse magnetization that occurs concomitant with application of the main slice-select gradient 324.

Figure 4:
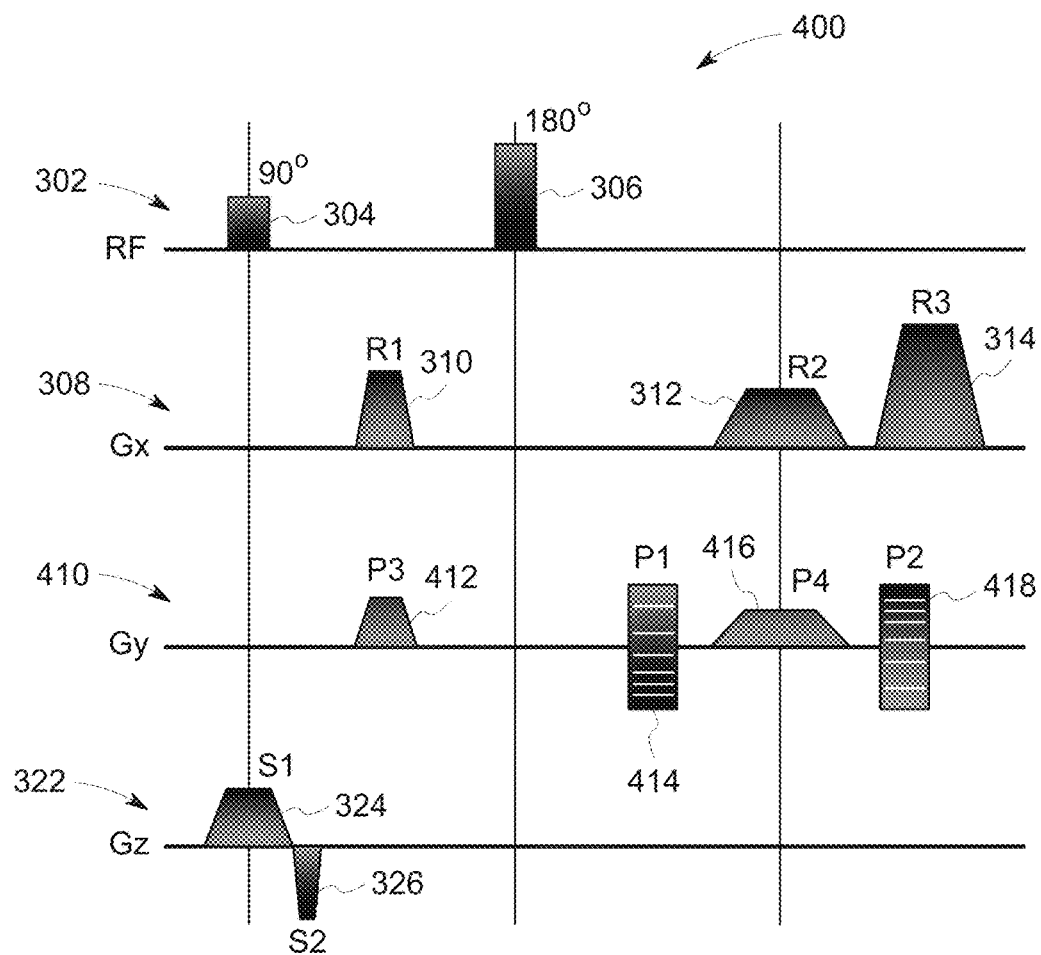
FIG. 4 is a schematic diagram of a pulse sequence diagram for a MRI system, in accordance with an embodiment of the present technique.

FIG. 4 is a schematic diagram depicting a pulse sequence diagram 400 for a MRI system in accordance with an embodiment of the present technique. The pulse sequences diagram 400 may be generated by different modules of MRI system control 32 of FIG. 1. The embodiment shown in FIG. 4 uses the similar element number for the corresponding component of the embodiment shown for above in FIG. 3. Similar to FIG. 3, pulse sequence diagram 400 of FIG. 4 includes RF signal waveform 302, readout gradient signal waveform 308 Gx, and slice selection gradient signal waveform 322 Gz. However, the phase gradient signal waveform 316 in FIG. 3 has been replaced with a new phase gradient signal waveform 410 Gz in FIG. 4. Each of the gradient signal waveforms 308, 410 and 322 excites a corresponding physical gradient coil in a gradient coil assembly 50. Specifically, the gradient coil assembly 50 comprises a readout gradient coil, a phase gradient coil and a slice select gradient coil. The gradient signal waveforms 308, 410 and 322 excite the readout gradient coil, the phase gradient coil and the slice select gradient coil respectively. The RF signal waveform 302 includes a 90° RF pulse 304 followed by a 180° RF pulse 306. This combination of 90° RF pulse and 180° RF pulse is repeated at each time interval TR (Repetition time). With each repetition, a k-space line of the k-space is filled. As will be appreciated by those skilled in the art, a partial sampling k-space may also be used in one embodiment. In the partial k-space, all the lines of k-space are not filled rather some lines of k-space are skipped.

Figure 5:
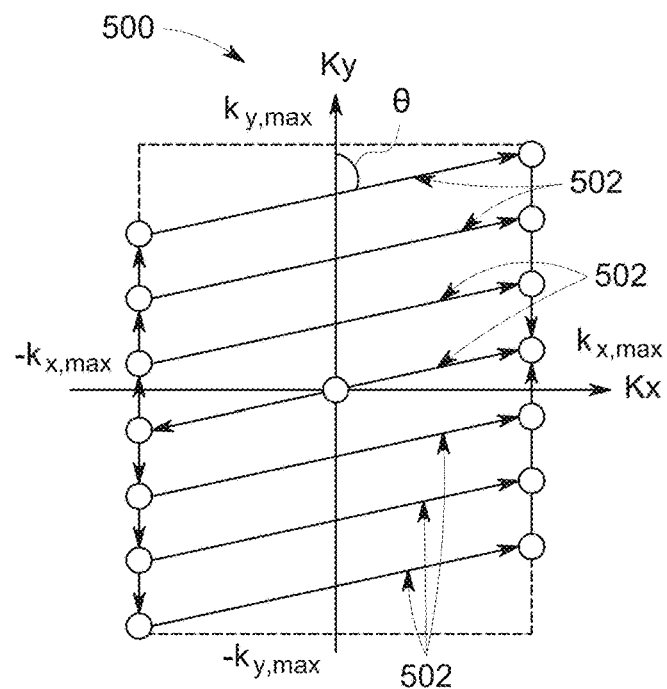
FIG. 5 is a schematic diagram of a k-space trajectory obtained with the pulse sequence diagram of FIG. 4, in accordance with an embodiment of the present technique.

The phase gradient signal waveform 410 shows a SIREN dephaser gradient 412, a first phase encoding gradient 414, a SIREN gradient 416 and a second phase encoding gradient 418. The SIREN dephaser gradient 412 is applied before the first phase encoding gradient 414 and the SIREN gradient is applied between the first and second phase encoding gradients 414 and 418 respectively. The first and second phase encoding gradients 414 and 418 are applied similar to gradient 318 and 320 to fill the k-space and to create a net zero phase shift respectively. Further, SIREN dephaser gradient 412 is applied simultaneously at the time of applying dephase lobe 310 and SIREN gradient 416 is applied simultaneously at the time of applying main readout lobe 312. The effect of applying SIREN gradient 416 is that it results in shears in readout encoding direction as can be seen in FIG. 5. Moreover, phase aliasing artifacts in the images can be reduced because of the SIREN gradient 416 as will be explained below. It should be noted that the present invention is not limited to the pulse sequence diagram 400 of FIG. 4. In another embodiment, a different pulse sequence diagram to obtain MR images may also be used along with the SIREN gradient 416. For example, the pulse sequence diagram may be diffusion weighted sequences, inversion recovery sequences, gradient echo sequences etc.

FIG. 5 is a schematic diagram of a k-space trajectory 500 in accordance with an embodiment of the present technique. As compared to k-space 200, in k-space 500, k-space lines 502 are tilted with respect to the x-axis by a shear angle of θ. This shear angle is caused by SIREN gradient 416 that is applied to y or phase gradient coil of gradient coil assembly 50. Therefore, k-space 500 is also referred to as a SIREN k-space data. The value of shear angle θ depends on amplitude R2 of main readout lobe 312 and amplitude P4 of SIREN gradient 416. In one embodiment, the shear angle is θ given as:

$$\theta = \tan^{-1}\frac{P4}{R2} \quad (1)$$

Figure 6:
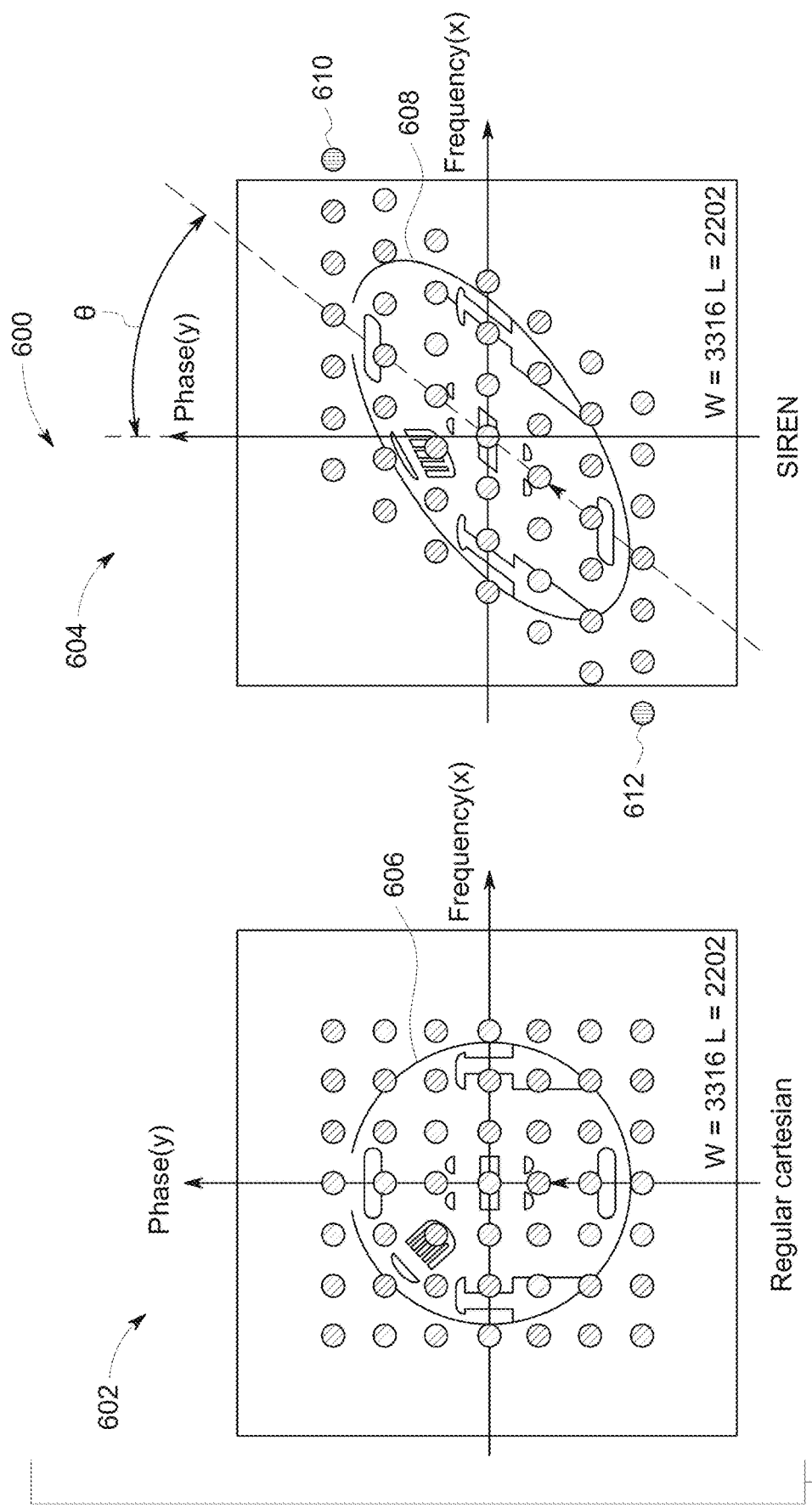
FIG. 6 is a schematic diagram depicting a comparison of regular cartesian image space and a SIREN image space, in accordance with an embodiment of the present technique.

FIG. 6 is a schematic diagram 600 depicting a comparison of regular cartesian image space 602 and a SIREN image space 604. It will be appreciated by those skilled in the art that image spaces 602 and 604 are obtained after applying Fourier transforms to respective k-spaces 200 and 500. The regular cartesian image space 602 is the result of pulse sequence diagram 300 and the SIREN image space 604 is the result of pulse sequence diagram 400. It should be noted that no phase aliasing effect is shown in either regular cartesian image space 602 or a SIREN image space 604. The phase aliasing effect will be shown in FIG. 7. An object image 606 corresponding to regular cartesian image space 602 is a straight image whereas an object image 608 corresponding to SIREN image space 604 is a titled image by the shear angle θ. Because of this shear angle, the (x, y) coordinate in image 606 will shift to the coordinate (x+y*tan θ, y) in image 608. In other words, the y coordinate will be the same, but x coordinate will shift by y*tan θ factor in image 606. It should be noted because of this coordinate shift, points 610, 612 fall outside of image space 604 and hence get cut from the final image. However, these points are outside of the interest of image 608 and so do not cause any issue. Further, in one embodiment, to make the image 608 straight, a mathematical transformation or a decoding/deshearing algorithm that converts the coordinates from (x+y*tan θ, y) to (x, y) is applied to SIREN image space data 604. In another embodiment, instead of transforming the image using the decoding algorithm, the SIREN kspace 500 itself may be first transformed into a regular k-space data (Also referred to as straight domain k-space data) and then the regular k-space data may be used to generate the regular image (or the straight image) of the object using Inverse Fourier Transform (IFT).

Figure 7:
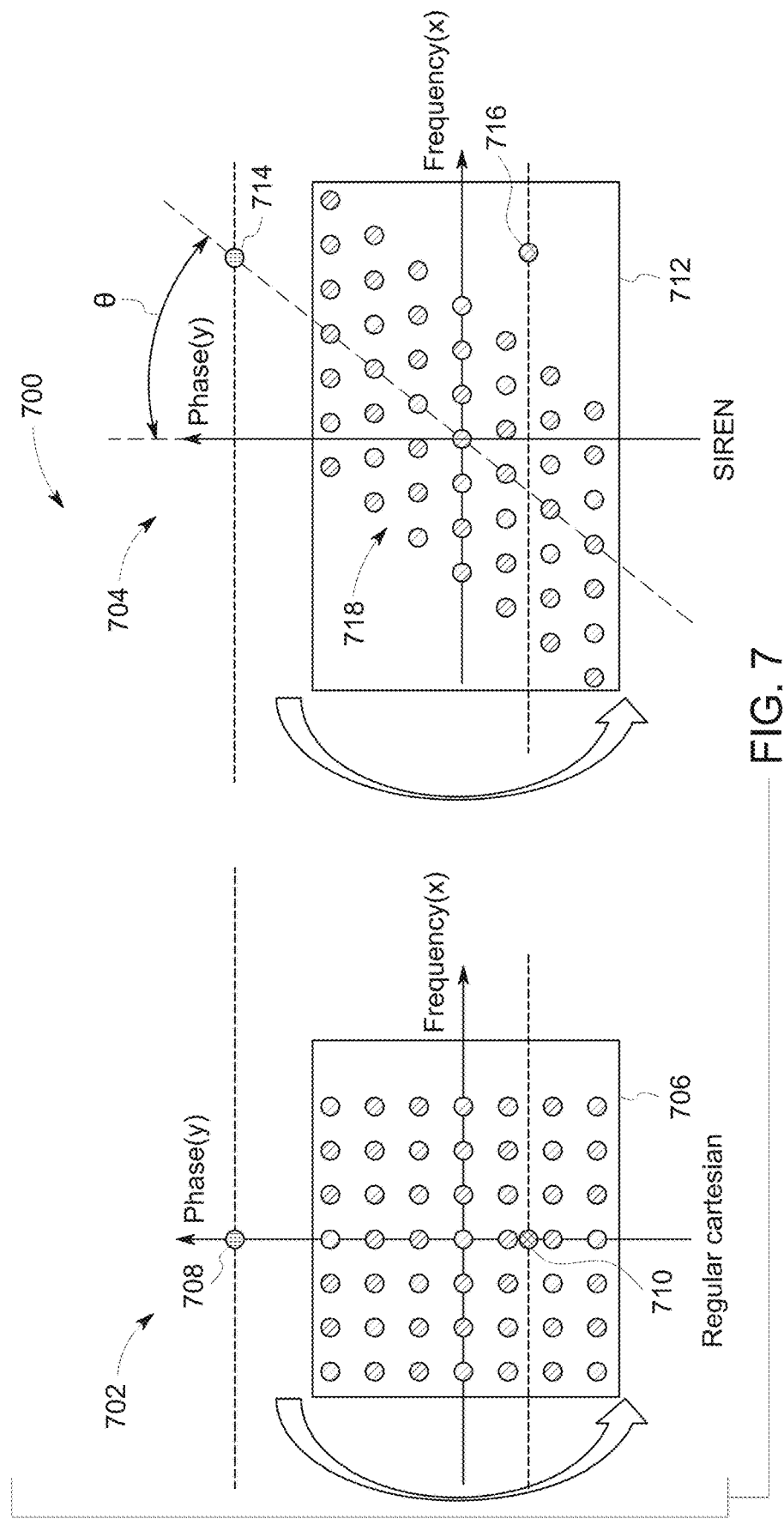
FIG. 7 is a schematic diagram depicting the phase aliasing effect in both regular cartesian image space and a SIREN image space, in accordance with an embodiment of the present technique.

FIG. 7 is a schematic diagram 700 depicting the phase aliasing effect in both regular cartesian image space 702 and a SIREN image space 704. The phase aliasing artifact occurs in MR images when the field of view (FOV) is smaller than the body part being imaged. In such cases, objects outside of one side of the FOV are projected onto the other side of the FOV in the image. In FIG. 7, regular cartesian FOV is represented by box 706 whereas SIREN FOV is represented by box 712. As can be seen, because of the phase aliasing effect, an object 708 which falls outside of FOV 706 gets projected at point 710 in the image space which causes an image artifact. By increasing FOV up to the object point 708, this phase aliasing effect can be avoided. However, the scan time for the imaging increases as the FOV is increased.

Similar to regular cartesian, for SIREN acquisition also an object 714 which is outside of FOV 712 gets projected at point 716. However, in SIREN acquisition, the image is sheared by angle θ as explained above. Therefore, even though object 714 gets projected on the other side of FOV 712, the projection 716 falls outside of area of interest or the main image space 718. Therefore, when the deshearing algorithm is applied to SIREN image space 704, there is no artifact in the desheared image due to phase aliasing.

Figure 8:
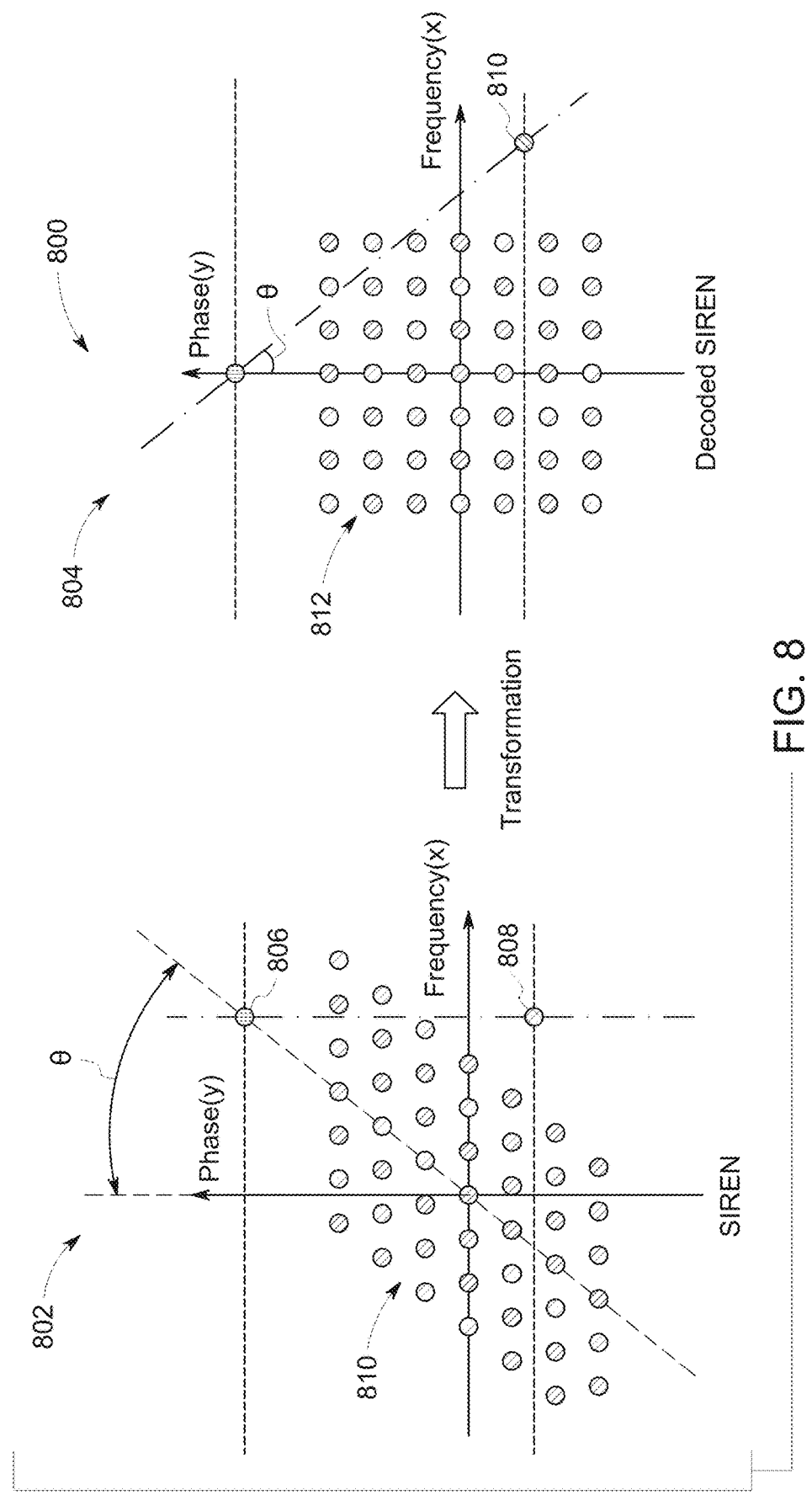
FIG. 8 is a schematic diagram depicting the transformation of SIREN image space into a decoded SIREN image space, in accordance with an embodiment of the present technique.

FIG. 8 is a schematic diagram 800 depicting the transformation of SIREN image space 802 into a decoded SIREN image space 804. The decoded SIREN image space 804 is obtained after applying a decoding/deshearing algorithm to SIREN image space 802 in order to obtain an unsheared image. In one embodiment, the deshearing algorithm is a mathematical transformation factor. As discussed earlier, in the SIREN image space 802, an object 806 that is outside of FOV gets projected at point 808 which falls outside of area of interest or the main image space 810. Now when the deshearing algorithm is applied, the image space 802 is desheared to generate the decoded SIREN image space 804. In the decoded SIREN image space 804, the all the x coordinates move to the left side by a distance equal to y*tan θ. Thus, even the projected object 808 in image space 802 moves by the same distance to point 810 which is still outside of the area of interest or the main image space 812. It should be noted that the shear angle θ decides where the projection of object 806 will fall in image space 802 or 804. For example, if is equal to zero then there is no shear factor and then the projection of object 806 will be on the main image as shown in regular cartesian image space 702 causing an artifact in the final image. Further, it should be noted that when the deshearing algorithm is applied to SIREN image space 802, a portion of the image may get cut off as explained with respect to points 610, 612 of FIG. 6.

Figure 9:
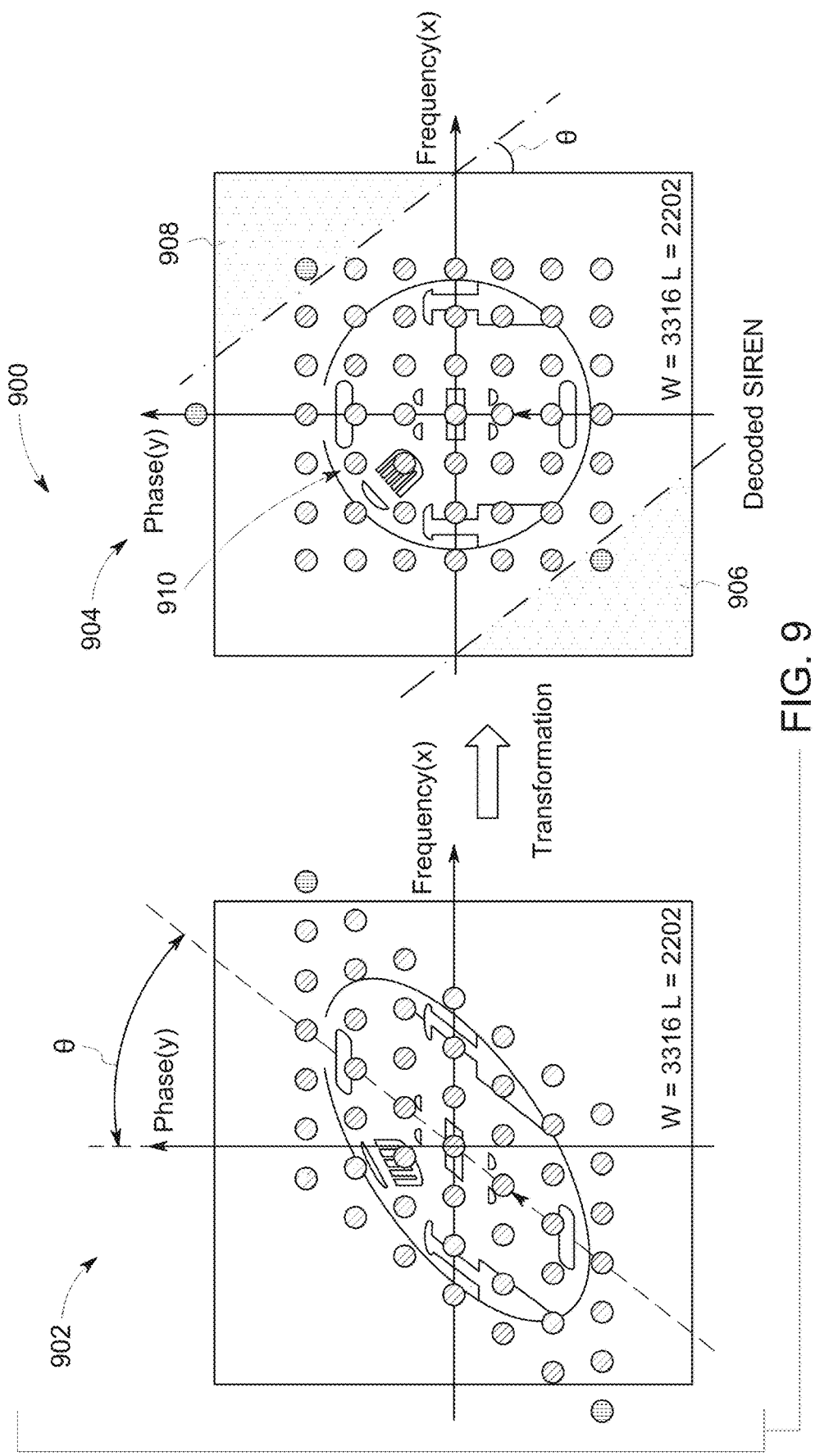
FIG. 9 is a schematic diagram depicting the effect of image cut due to transformation of the SIREN image space into a decoded SIREN image space, in accordance with an embodiment of the present technique.

FIG. 9 is a schematic diagram 900 depicting the effect of image cut due to transformation of SIREN image space 902 into a decoded SIREN image space 904. Mainly the shaded corners 906 and 908 are cut off from the decoded SIREN image space 904 after the transformation. As can be seen, if the any portion of the image of interest 910 does not fall under the shaded portion 906 and 908 then there is no issue even if shaded portions 906 and 908 get cut from the final image. However, in some cases, it may happen that a portion of the main image 910 falls within the shaded portion and may get cut. In such cases, it may be desired to reduce the shear angle which may introduce a bit of phase aliasing effect. Thus, the selection of shear angle depends on the medical application i.e., it depends on which part of the body is getting imaged. Alternatively, in some embodiments, the FOV may be increased in the frequency or x direction which covers more area of the image and avoids image cutting. By increasing FOV in X direction scan time may increase. However, the increase in scan time for this case may not be as big as for the case if the FOV was increased in Y or phase direction. Further, in another embodiment, a mask may be applied to the area that will get cut in the final image. Applying mask to the cutoff areas will reduce the processing time of the system.

Figure 10:
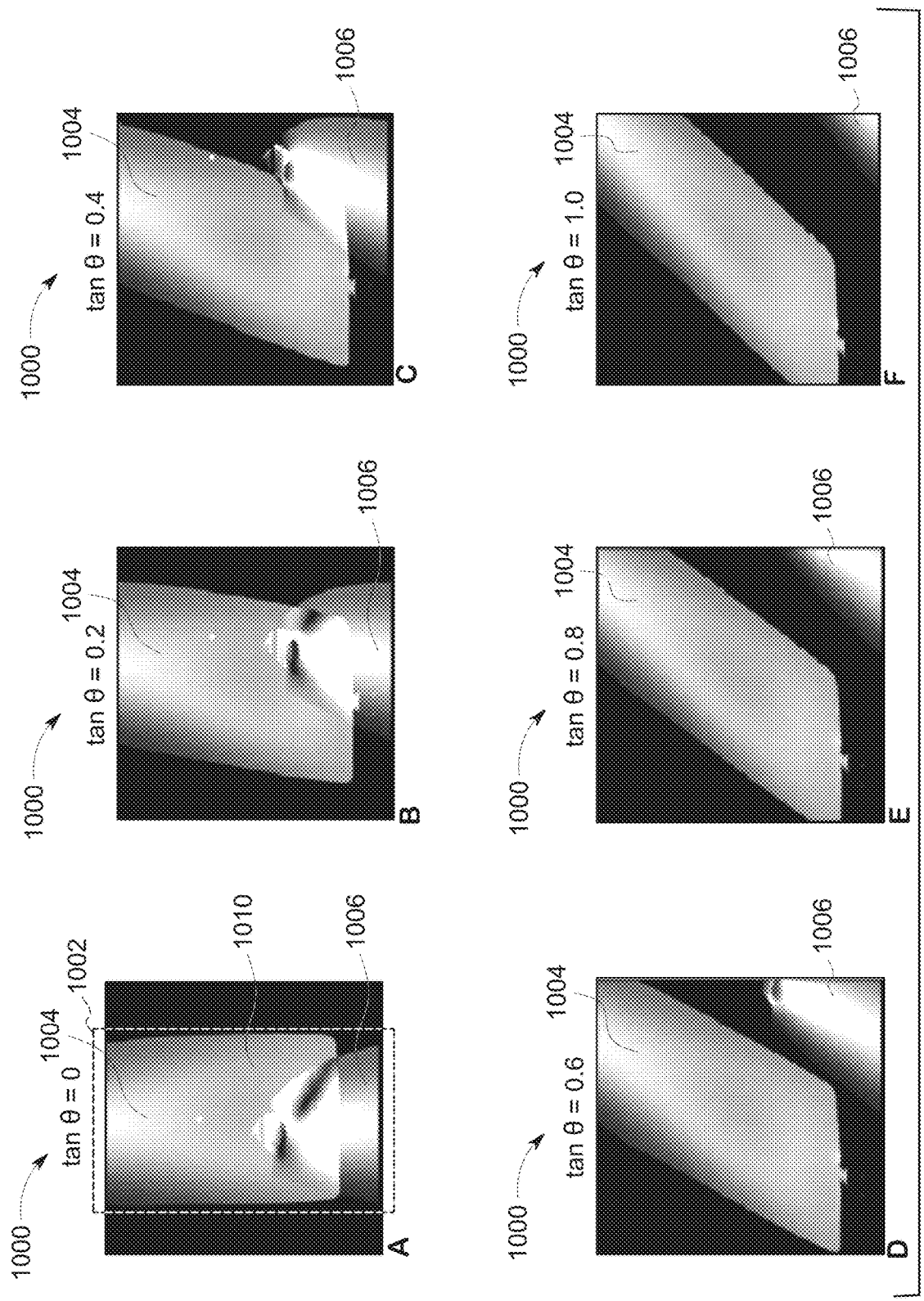
FIG. 10 is a schematic diagram depicting the effect of shear angle variation on the phase aliasing effect, in accordance with an embodiment of the present technique.

FIG. 10 is a schematic diagram 1000 depicting the effect of shear angle variation on the phase aliasing effect, in accordance with an embodiment of the present technique. Specifically, FIG. 10 shows six different images A, B, C, D, E, F of an object 1002 corresponding to six different shear factors (tan θ) 0, 0.2, 0.4, 0.6, 0.8 and 1.0. The object 1002 has a portion 1004 which is under FOV and another portion 1006 which is on top of portion 1004 but outside of FOV. However, due to phase aliasing effect, the portion 1006 gets projected/overlapped on bottom side of the portion 1004. As the shear factor is increased from 0 to 1, the portion 1006 starts drifting away from portion 1004. It can be seen that in images D, E and F, the portion 1006 is completely out of the area of interest 1004. However, at the same time the portion 1004 also gets sheared in accordance with the shear factor.

Further, it should be noted that in image A, there is one artifact 1010 caused due to annefact effect. As will be appreciated by those skilled in the art, MR signals generated at the regions with nonlinear gradient fields such as at the corners or borders cause the annefact effect in MR images. With the SIREN technique presented herein, the annefact artifact 1010 also moves out of the area of interest i.e., portion 1006 as the shear factor increases from 0 to 1.

Figure 11:
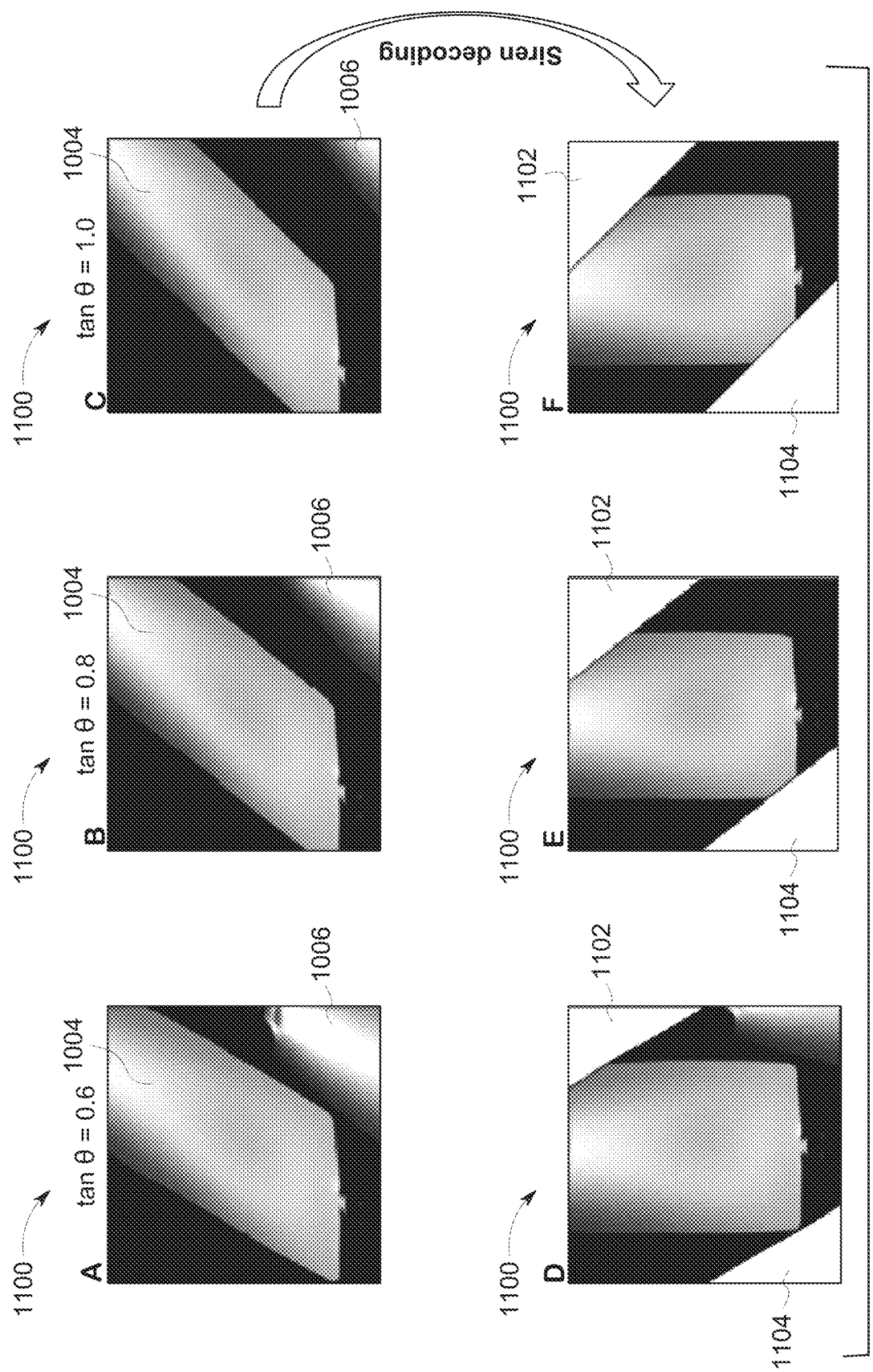
FIG. 11 is a schematic diagram depicting the effect of SIREN decoding on the image in FIG. 10, in accordance with an embodiment of the present technique.

FIG. 11 is a schematic diagram 1100 depicting the effect of SIREN decoding on the image in FIG. 10, in accordance with an embodiment of the present technique. Specifically, FIG. 11 shows three images D, E, F and their SIREN decoded versions G, H, I respectively after applying the deshearing algorithm on them. The three images D, E, F corresponds to shear factors (tan θ) equal to 0.6, 0.8 and 1.0 respectively. As can be seen from image G, H and I, the application of deshearing algorithm makes the images D, E, F unsheared. However, at the same time a portion of each image also gets cut during this process. For example, the two corners 1102 and 1104 in all the image G, H, I get cut because of the SIREN decoding. The size of the corner that gets cut depends on the shear factor tan θ. For example, image G corresponding to shear factor tan θ=0.6 has the least corner area cut whereas the image I corresponding to shear factor tan θ=1.0 has the maximum corner area cut among the three images. Thus, the shear factor or the shear angle θ is determined based on the medical application i.e., which body part is getting imaged and the field of view.

In one embodiment, once the shear angle θ is known, then the amplitude P4 of SIREN gradient 416 can be determined as:

$$P4 = R2 \tan \theta \qquad (2)$$

Where R2 is the amplitude of main readout lobe or pulse 312. Further, the area under the SIREN dephaser gradient pulse 412 (i.e., SIREN dephaser area) is set to be equal to half of the area under the SIREN gradient 416 (i.e., SIREN area). Based on SIREN dephaser area (Ad), the amplitude P3 of SIREN dephaser can be determined as:

$$P3 = \frac{2Ad}{(d1+d2)} \quad (3)$$

where d1 and d2 are the base and peak pulse durations of the SIREN dephaser gradient pulse 412 and are equal to base and peak pulse durations of diphase lobe or pulse 310.

Figure 12:
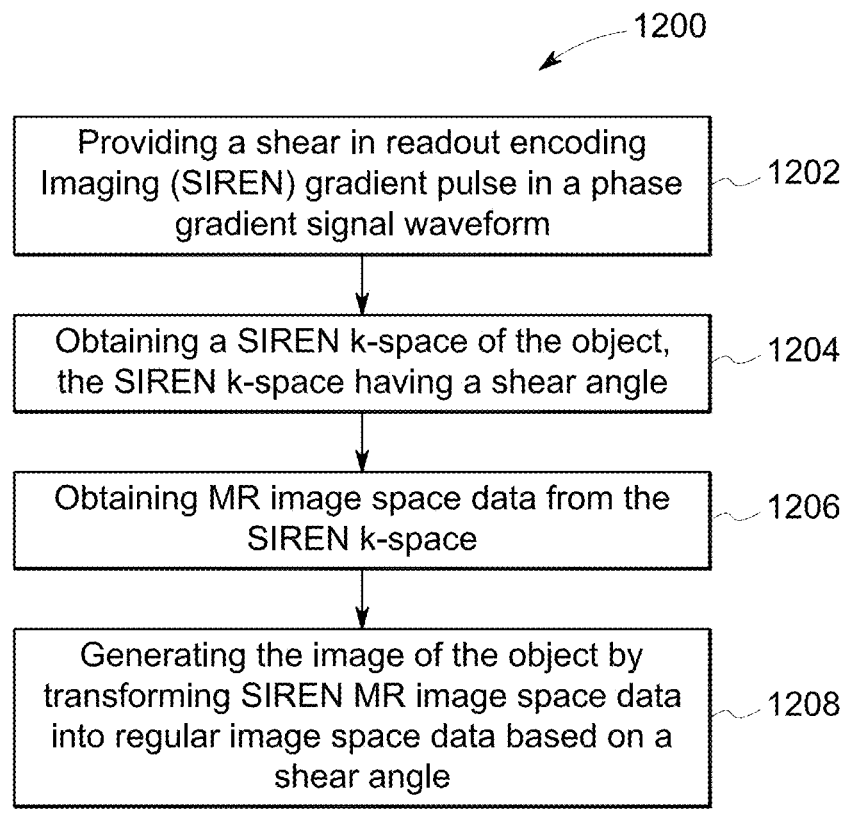
FIG. 12 is a flowchart of a method for generating MR image of an object with a MRI system, in accordance with an embodiment of the present technique.

FIG. 12 is a flowchart of a method 1200 for generating MR image of an object with a MRI system 10 according to an embodiment of the present technique. At step 1202, the method includes providing a Shear In Readout Encoding Imaging (SIREN) gradient pulse 416 in a phase gradient signal waveform 410 of the MRI system. In general, the MRI system includes three gradient signal waveforms: a readout gradient signal waveform 308, a slice selection gradient signal waveform 322 and the phase gradient signal waveform 410 as shown in FIG. 4. The readout gradient signal waveform 308 includes a diphase lobe or pulse 310, a main readout pulse 312 and a spoiler pulse 314. The phase gradient signal waveform 410 includes a SIREN dephaser gradient 412, a first phase encoding gradient 414 and a second phase encoding gradient 418 apart from the SIREN gradient pulse 416. The application of SIREN gradient pulse 416 results in a SIREN MR k-space 500 of the object which is obtained at step 1204. The SIREN MR k-space 500 has a shear angle θ as shown in FIG. 5.

At step 1206, the method includes obtaining MR image space data. In one embodiment, a reconstruction technique is applied to SIREN MR k-space 500 to obtain the MR image space data 802 as shown in FIG. 8. The reconstruction technique may include an inverse Fourier transform. The shear angle θ from SIREN MR k-space 500 also reflects in the MR image space data 802. Therefore, at step 1208, the MR image space data (also referred to as "SIREN image space data") is transformed into regular domain image space data 804 (also referred to as "decoded image space data") based on the shear angle θ to generate the image of the object. In one embodiment, a mathematical transformation or a decoding/deshearing algorithm that converts the coordinates of MR image space data 802 from (x+y*tan θ, y) to (x, y) is applied to generate the regular domain image space data 804 or the artifact reduced image of the object.

Figure 13:
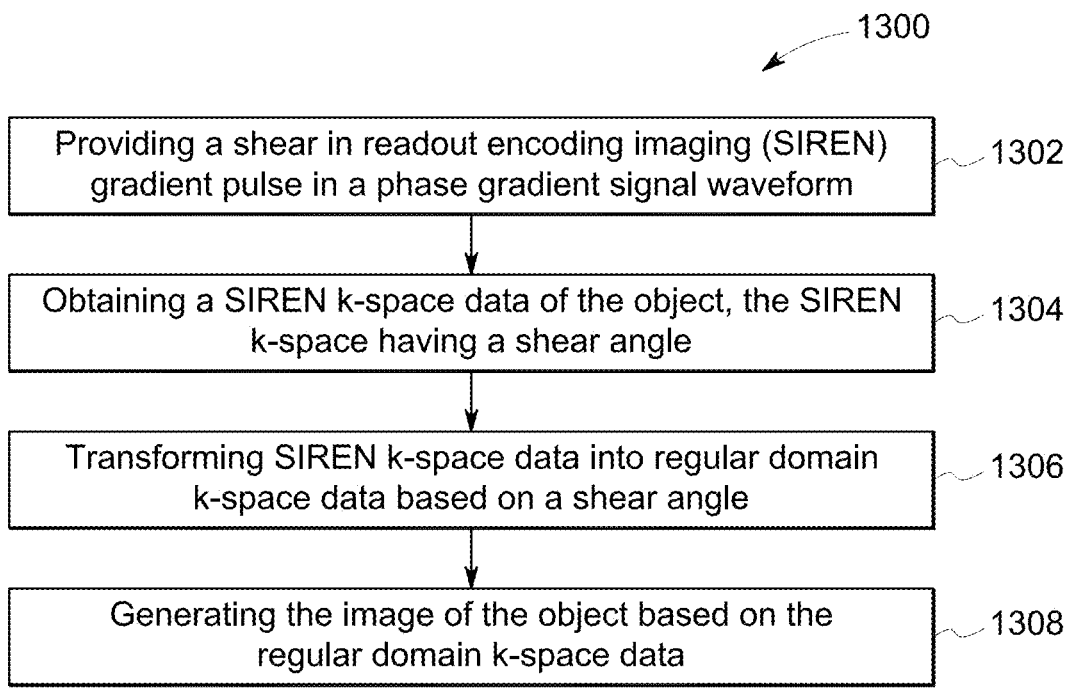
FIG. 13 is a flowchart of another method for generating MR image of an object with a MRI system, in accordance with an embodiment of the present technique.

FIG. 13 is a flowchart of another method 1300 for generating MR image of an object with a MRI system 10 according to an embodiment of the present technique. The main difference between method 1200 and method 1300 is that in method 1300, the SIREN MR k-space itself is transformed to regular domain k-space instead of transforming the MR image space data into regular domain image space data. Thus, at step 1302, the method 1300 includes providing a Shear In Readout Encoding Imaging (SIREN) gradient pulse 416 in a phase gradient signal waveform 410 of the MRI system. The phase gradient signal waveform 410 includes a SIREN dephaser gradient 412, a first phase encoding gradient 414 and a second phase encoding gradient 418 apart from the SIREN gradient pulse 416. The application of SIREN gradient 416 results in a SIREN MR k-space 500 of the object which is obtained at step 1304. The SIREN MR k-space 500 has a shear angle θ as shown in FIG. 5.

At step 1306, the method includes transforming SIREN k-space data into regular domain k-space data (also referred to as "decoded k-space data") based on the shear angle. In one embodiment, a mathematical transformation or a decoding/deshearing algorithm is applied to the SIREN k-space data to convert it into the regular domain k-space data. Finally, at step 1308, the image of the object is generated based on the regular domain k-space data. In one embodiment, a reconstruction technique is applied to the regular domain k-space data to obtain the MR image of the object.

One of the advantages of the present technique is that it reduces or eliminates the phase aliasing artifacts and annefact artifacts in the images. Further, the technique can be applied to 2D as well as 3D image acquisition of the object. When a 3D image of the object is desired an additional SIREN gradient pulse is also provided in slice selection gradient signal waveform 322. Moreover, with the present technique, FOV need not be increased to reduce the phase aliasing artifacts and thus, this reduces the scan time.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for producing an image of an object with a magnetic resonance imaging (MRI) system, the method comprising:
   providing a Shear In Readout Encoding Imaging (SIREN) gradient pulse in a phase gradient signal waveform applied to a phase gradient coil of the MRI system;
   obtaining a SIREN k-space of the object, wherein k-space lines of the SIREN k-space have a shear angle;
   obtaining MR image space data from the SIREN k-space; and
   generating the image of the object by transforming SIREN MR image space data into regular image space data using a decoding algorithm based on the shear angle.

2. The method of claim 1 further comprising applying a readout gradient signal waveform to a readout gradient coil of the MRI system, wherein the readout gradient signal waveform includes a dephase pulse and a main readout pulse.

3. The method of claim 2, wherein the phase gradient signal waveform includes a first phase encoding gradient pulse and a second phase encoding gradient pulse and wherein the SIREN gradient pulse is applied between the first phase encoding gradient pulse and the second phase encoding gradient pulse.

4. The method of claim 2, wherein an amplitude of the SIREN gradient pulse is determined based on the shear angle and the amplitude of the main readout pulse.

5. The method of claim 2, wherein the SIREN gradient pulse is applied simultaneously at the time of the main readout pulse.

6. The method of claim 1 further comprising providing a SIREN dephaser gradient pulse before the SIREN gradient pulse in the phase gradient signal waveform applied to the phase gradient coil of the MRI system.

7. The method of claim 6, wherein an area under the SIREN dephaser gradient pulse is half that of an area under the SIREN gradient pulse.

8. The method of claim 1, wherein the shear angle is determined based on a medical image application, a field of view or combinations thereof.

9. The method of claim 1, wherein obtaining MR image space data from the SIREN k-space comprises applying an inverse Fourier transform to the SIREN k-space.

10. The method of claim 1, wherein the decoding algorithm shifts the x-axis coordinates of SIREN MR image space by a factor y*tan θ, where y is the corresponding y-axis coordinate of the SIREN MR image space and θ is the shear angle.

11. The method of claim 1, wherein when the image of the object has a cutoff area, the method includes using a larger field of view in the y-axis of the SIREN MR image space data.

12. The method of claim 1, wherein when the image of the object is a 3D image, the method includes providing an additional SIREN gradient pulse in a slice selection gradient signal waveform of the MRI system.

13. A magnetic resonance imaging (MRI) system, comprising:
a magnet configured to generate a polarizing magnetic field about at least a portion of an object arranged in the MRI system;
a gradient coil assembly including a readout gradient coil, a phase gradient coil, a slice selection gradient coil configured to apply at least one gradient field to the polarizing magnetic field;
a radio frequency (RF) system configured to apply an RF field to the object and to receive magnetic resonance signals from the object;
a processing system programmed to:
provide a Shear In Readout Encoding Imaging (SIREN) gradient pulse in a phase gradient signal waveform, wherein the phase gradient signal waveform is applied to the phase gradient coil;
obtain a SIREN k-space of the object, wherein k-space lines of the SIREN k-space have a shear angle;
obtain MR image space data from the SIREN k-space; and
generate the image of the object by transforming SIREN MR image space data into regular image space data using a decoding algorithm based on the shear angle.

14. The MRI system of claim 13, wherein the processing system is programmed to apply a readout gradient signal waveform to a readout gradient coil of the MRI system, wherein the readout gradient signal waveform includes a dephase pulse and a main readout pulse.

15. The MRI system of claim 14, wherein the phase gradient signal waveform includes a first phase encoding gradient pulse and a second phase encoding gradient pulse and wherein the SIREN gradient pulse is applied between the first phase encoding gradient pulse and the second phase encoding gradient pulse.

16. The MRI system of claim 14, wherein an amplitude of the SIREN gradient pulse is determined based on the shear angle and the amplitude of the main readout pulse.

17. The MRI system of claim 13, wherein the processing system is programmed to obtain MR image space data from the SIREN k-space by applying an inverse Fourier transform to the SIREN k-space.

18. The MRI system of claim 13, wherein the decoding algorithm shifts the x-axis coordinates of SIREN MR image space by a factor y*tan θ, where y is the corresponding y-axis coordinate of the SIREN MR image space and θ is the shear angle.

19. The MRI system of claim 13, wherein when the image of the object is a 3D image, the processing system is programmed to provide an additional SIREN gradient pulse in a slice selection gradient signal waveform of the MRI system.

20. A method for producing an image of an object with a magnetic resonance imaging (MRI) system, the method comprising:
providing a Shear In Readout Encoding Imaging (SIREN) gradient pulse in a phase gradient signal waveform applied to a phase gradient coil of the MRI system;
obtaining a SIREN k-space data of the object, wherein k-space lines of the SIREN k-space data have a shear angle;
transforming SIREN k-space data of the object into regular domain k-space data using a decoding algorithm based on the shear angle; and
generating the image of the object from the regular domain k-space data.

* * * * *